United States Patent
Tomic et al.

(10) Patent No.: US 10,956,049 B2
(45) Date of Patent: Mar. 23, 2021

(54) WEAR-AWARE BLOCK MODE CONVERSION IN NON-VOLATILE MEMORY

(71) Applicant: INTERNATIONAL BUSINESS MACHINES CORPORATION, Armonk, NY (US)

(72) Inventors: Sasa Tomic, Rueschlikon (CH); Roman Alexander Pletka, Uster (CH); Nikolas Ioannou, Zurich (CH); Nikolaos Papandreou, Thalwil (CH); Aaron D. Fry, Richmond, TX (US); Timothy Fisher, Cypress, TX (US); Radu Ioan Stoica, Zurich (CH)

(73) Assignee: International Business Machines Corporation, Armonk, NY (US)

(*) Notice: Subject to any disclaimer, the term of this patent is extended or adjusted under 35 U.S.C. 154(b) by 57 days.

(21) Appl. No.: 16/439,122

(22) Filed: Jun. 12, 2019

(65) Prior Publication Data
US 2020/0393972 A1 Dec. 17, 2020

(51) Int. Cl.
*G06F 3/06* (2006.01)
*G06F 12/02* (2006.01)
(Continued)

(52) U.S. Cl.
CPC ............ *G06F 3/0616* (2013.01); *G06F 3/064* (2013.01); *G06F 3/0619* (2013.01);
(Continued)

(58) Field of Classification Search
CPC .... G06F 3/0646; G06F 3/0649; G06F 3/0683; G06F 3/0685; G06F 3/0688;
(Continued)

(56) References Cited

U.S. PATENT DOCUMENTS 9,933,963 B1 4/2018 Alhussien et al.
10,101,931 B1* 10/2018 Camp ................. G06F 12/0866
(Continued)

FOREIGN PATENT DOCUMENTS

CN 107967121 4/2018
TW 201907300 2/2019

OTHER PUBLICATIONS

IP.com, "Method to prolong the life of a Multi-level cell Flash Disk Cache", Sep. 24, 2010 (Year: 2010).*
(Continued)

*Primary Examiner* — Khoa D Doan
(74) *Attorney, Agent, or Firm* — Stosch Sabo; Brian F. Russell

(57) ABSTRACT

A non-volatile memory includes a plurality of physical blocks of storage each including a respective plurality of cells, where each of the plurality of cells is individually capable of storing multiple bits of data. A controller assigns physical blocks among the plurality of physical blocks to a first pool containing physical blocks operating in a first (e.g., QLC) mode for storing a greater number of bits per cell and assigns other physical blocks among the plurality of physical blocks to a second pool containing physical blocks operating in a second (e.g., SLC) mode for storing a lesser number of bits per cell. The controller transfers physical blocks between the first pool and the second pool based on at least bit error rates measured for the transferred physical blocks.

17 Claims, 6 Drawing Sheets

(51) Int. Cl.
*G11C 16/26* (2006.01)
*G11C 11/56* (2006.01)
*G11C 16/34* (2006.01)
*G11C 16/16* (2006.01)

(52) U.S. Cl.
CPC .......... *G06F 3/0653* (2013.01); *G06F 3/0688* (2013.01); *G06F 12/0246* (2013.01); *G11C 11/5628* (2013.01); *G11C 11/5642* (2013.01); *G11C 16/16* (2013.01); *G11C 16/26* (2013.01); *G11C 16/3495* (2013.01); *G06F 2212/7201* (2013.01); *G11C 2211/5641* (2013.01)

(58) Field of Classification Search
CPC ....... G06F 3/061–0619; G06F 12/0246; G06F 2212/7211; G11C 2211/5641
See application file for complete search history.

(56) References Cited

U.S. PATENT DOCUMENTS

| | | | |
|---|---|---|---|
| 10,126,958 B2 | 11/2018 | Ramalingam | |
| 2011/0271043 A1* | 11/2011 | Segal | G06F 12/0246 711/103 |
| 2012/0240012 A1* | 9/2012 | Weathers | G11C 29/44 714/773 |
| 2013/0124787 A1* | 5/2013 | Schuette | G11C 16/0483 711/103 |
| 2015/0067415 A1 | 3/2015 | Miyamoto et al. | |
| 2017/0269996 A1 | 9/2017 | Shono et al. | |
| 2018/0046376 A1 | 2/2018 | Ioannou et al. | |
| 2018/0293001 A1 | 10/2018 | Muchherla et al. | |
| 2018/0315487 A1 | 11/2018 | Avraham et al. | |
| 2019/0042130 A1* | 2/2019 | Vittal Prabhu | G06F 3/0634 |
| 2019/0065393 A1 | 2/2019 | Jean | |

OTHER PUBLICATIONS

Micheloni, R., Crippa, L., & Picca, M. (2018). Hybrid Storage Systems. In Inside Solid State Drives (SSDs) (pp. 43-59). Springer, Singapore.

Peleato, B., Tabrizi, H., Agarwal, R., & Ferreira, J. (Jun. 2015). BER-based wear leveling and bad block management for NAND flash. In 2015 IEEE International Conference on Communications (ICC), pp. 295-300.

Cai, Y., Ghose, S., Haratsch, E. F., Luo, Y., & Mutlu, O. (2017). Error characterization, mitigation, and recovery in flash-memory-based solid-state drives. Proceedings of the IEEE, 105(9), pp. 1666-1704.

Disclosed anonymously (Jan. 2016). Abstract: Optimize the life of SSD by intelligently swapping the write intensive used block data with least write intensive used block unit and consider this block unit for read only purpose for future use. IPCOM000244708D.

International application No. PCT/IB2020/055061, International filing date: May 28, 2020. International Search Report and Written Opinion (ISR/WO) dated Sep. 7, 2020.

* cited by examiner

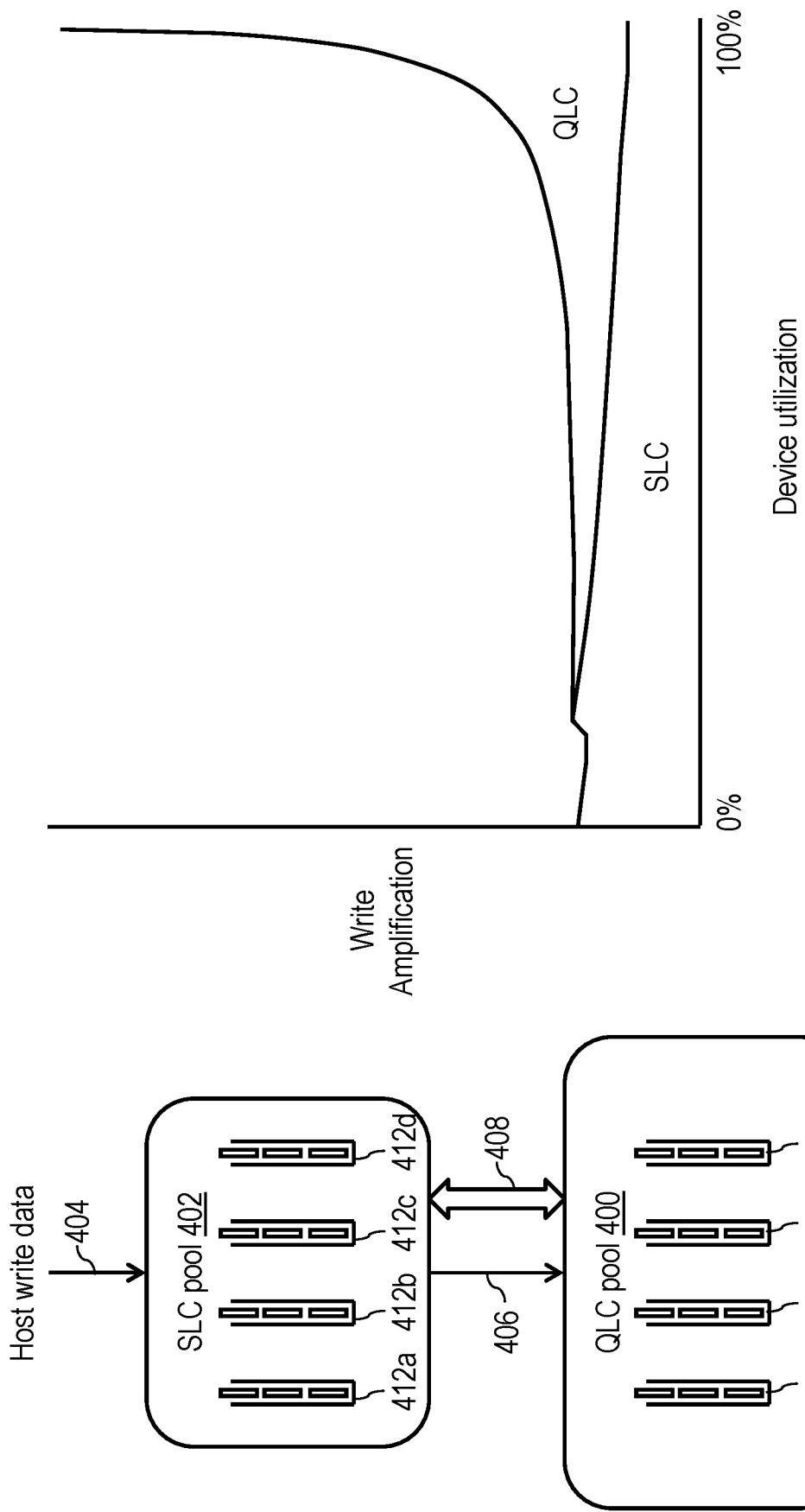

WEAR-AWARE BLOCK MODE CONVERSION IN NON-VOLATILE MEMORY

BACKGROUND OF THE INVENTION

This disclosure relates to data processing and data storage, and more specifically, to a non-volatile memory system in which blocks are capable of operating in multiple block modes providing differing per-cell bit storage capacities. Still more particularly, the disclosure relates to wear-aware conversion of blocks of physical storage in a non-volatile memory system between differing block modes.

NAND flash memory is an electrically programmable and erasable non-volatile memory technology that stores one or more bits of data per memory cell as a charge on the floating gate of a transistor or a similar charge trap structure. The amount of charge on the floating gate modulates the threshold voltage of the transistor. By applying a proper read voltage and measuring the amount of current, the programmed threshold voltage of the memory cell can be determined, and thus the stored information can be detected. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access the memory cells, flash memory arrays have generally been programmed on a page basis, but erased on a block basis.

Flash storage technology has seen an impressive growth in bit storage density over the past decade, driven by the objective of decreasing the price per gigabyte of flash storage. One of the key drivers of this trend is the steady increase in the number of bits stored per flash cell. For example, the number of bits that can be stored per flash cell has steadily increased from one (Single Level Cell (SLC)) to two (Multi-Level Cell (MLC)) to three (Three Level Cell (TLC)) and, most recently, to four (Quad Level Cell (QLC)). The increased number of bits that can be stored per flash cell comes at the cost of decreased endurance and performance as the number of bits per cell increases.

Enterprise-class flash controllers employ a variety of techniques to ameliorate the endurance and performance limitations of new generations of the NAND flash memory. For example, flash controllers may employ one or more flash management techniques, including implementing advanced error correction codes, adjusting voltage levels to reduce bit error rate, reducing internal garbage collection overhead by segregating data based on write heat, managing blocks based on block (i.e., health binning), and performing health-aware wear leveling and data placement. Despite the longevity and performance gains contributed by these advanced flash management techniques, as bit density continues to grow, the existing flash management techniques alone cannot guarantee an acceptable device lifetime (e.g., a 7-year or better warranty for enterprise class SSDs under a heavy write workload). For example, QLC NAND flash technology provides a 33% increase in storage density compared to TLC NAND flash technology, but has a rated useful life several times less than TLC NAND flash (e.g., only a few thousands program/erase (P/E) cycles per block).

One promising avenue for increasing device endurance is to take advantage of the ability of NAND flash memory to operate in multiple modes. For example, some TLC NAND flash memory supports an SLC mode in which certain selected blocks store only a single bit per cell, thus increasing performance and endurance for the selected blocks at the expense of storage density. Blocks configured in the SLC mode can sustain one to two orders of magnitude more P/E cycles, but provide only a third of the storage capacity of blocks configured in the TLC mode. In such systems, frequently written data can be stored in the SLC blocks, while infrequently written data can be stored on blocks operating in the native TLC mode.

Existing flash controllers that support multiple operating modes often employ a tiered architecture in which incoming user writes are first stored in the blocks of a lower storage density tier (e.g., a SLC tier). When storage in the lower storage density tier is exhausted (or reaches some other threshold fill level), the flash controller initiates a destaging process that frees space in the lower storage density tier by moving data from the lower storage density tier to a higher storage density tier (e.g., a TLC tier), preferably starting with the data least likely to be overwritten in the future. The flash controller then manages data residing in the higher storage density tier in the conventional manner, for example, by periodically relocating valid data from blocks selected for garbage collection, erasing the garbage-collected blocks, and thereafter again writing the erased blocks with data destaged from the lower storage density tier. In general, in conventional tiered storage architectures of this type, blocks are statically assigned to either the lower density storage tier or the higher storage density tier.

BRIEF SUMMARY

The present disclosure recognizes that the entirely static assignment of blocks to the various tiers of a multi-tiered memory storage system employing blocks of different bit storage densities can cause a given tier to prematurely run out of storage capacity or to reach its endurance limit. To address this issue, blocks of the non-volatile memory can be selectively converted between modes of operation.

In at least one embodiment, a non-volatile memory includes a plurality of physical blocks of storage each including a respective plurality of cells, where each of the plurality of cells is individually capable of storing multiple bits of data. A controller assigns physical blocks among the plurality of physical blocks to a first pool containing physical blocks operating in a first mode (e.g., QLC mode) for storing a greater number of bits per cell and assigns other physical blocks among the plurality of physical blocks to a second pool containing physical blocks operating in a second mode (e.g., SLC mode) for storing a lesser number of bits per cell. The controller transfers physical blocks between the first pool and the second pool based on at least bit error rates measured for the transferred physical blocks.

In at least one embodiment, the controller transfers, from the first pool to the second pool, physical blocks having a higher bit error rate and transfers, from the second pool to the first pool, physical blocks having a lower bit error rate.

In at least one embodiment, the controller, for each of the first and second pools, tracks the number of physical blocks allocated to store data for each of a plurality of write streams of differing write heats and the number of program/erase (P/E) cycles in each of the plurality of write streams. Additionally, the controller, for each of the plurality of write streams, calculates a respective stream wear metric based on the number of physical blocks assigned to the write stream and an aggregate number of P/E cycles of the physical blocks assigned to the write stream. The controller can then select physical blocks for transfer based on (1) a selected write stream among the plurality of write streams, (2) the stream wear metric of the selected write stream, and (3) block health of physical blocks allocated to store data for the selected write stream. The block health of physical blocks in all of the plurality of write streams can be determined, for example, from a bit error rate measured shortly after programming the physical blocks.

In at least one embodiment, the controller selects physical blocks for transfer such that, if the selected write stream has a stream wear metric reflecting a greatest wear among all of the plurality of write streams, the controller selects, for transfer, the healthiest physical blocks from among the physical blocks allocated to the selected write stream, and if the selected write stream has a stream wear metric reflecting a least wear among all of the plurality of write streams, the controller selects, for transfer, the least healthy physical blocks from among the physical blocks allocated to the selected write stream.

In at least one embodiment, the controller transfers the physical blocks between the first and second pools based on an available number of unprogrammed physical blocks from a given one of the first and second pools not satisfying a threshold.

BRIEF DESCRIPTION OF THE SEVERAL VIEWS OF THE DRAWINGS

FIG. 4 depicts an exemplary tiered storage architecture in which pools of physical blocks are configured to operate in different modes storing different numbers of bits per cell;

FIG. 5 is a graph of write amplification versus device utilization for an exemplary tiered storage architecture;

DETAILED DESCRIPTION

Figure 1A:
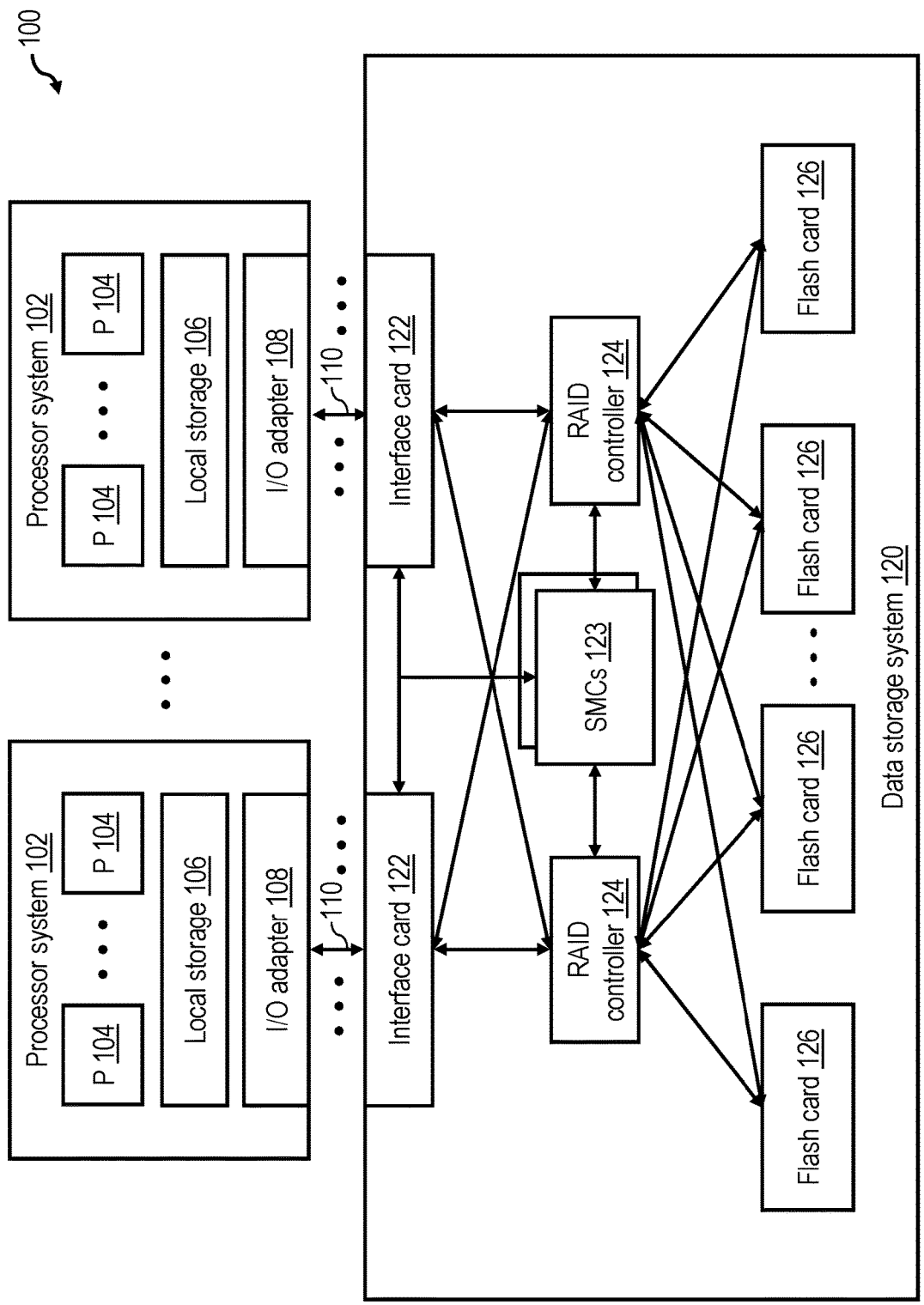
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, POWER, Intel x86, or any other processor combined with any of memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In some embodiments, data storage system 120 may be integral to a processor system 102. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O requests communicated via I/O channel 110 include read requests by which a processor system 102 requests data from data storage system 120 and write requests by which a processor system 102 requests storage of data in data storage system 120.

Although not required, in the illustrated embodiment, data storage system 120 includes multiple interface cards 122 through which data storage system 120 receives and responds to I/O requests of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
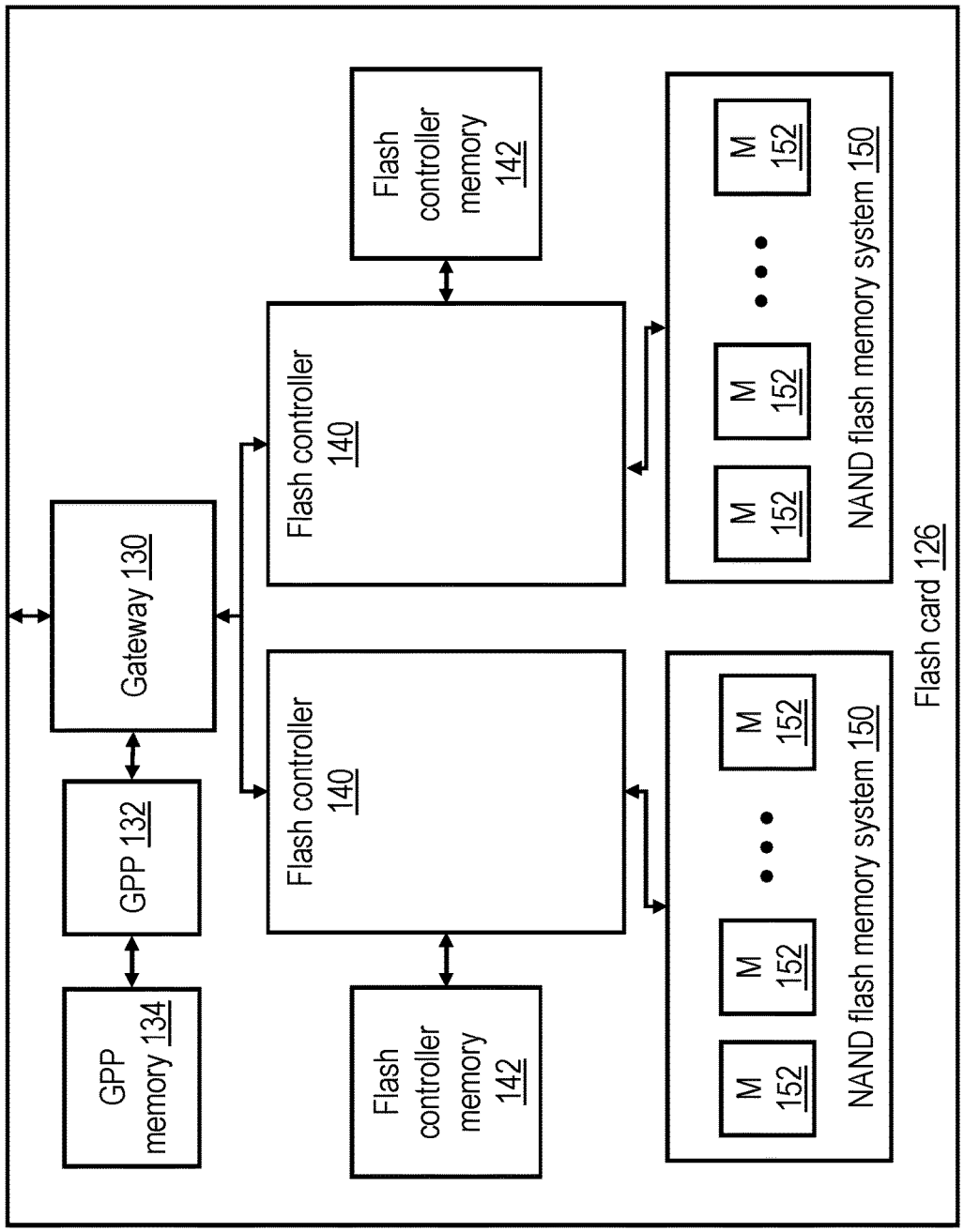
FIG. 1B is a more detailed block diagram of a flash card of the data storage system of FIG. 1A.

FIG. 1B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on requests received by gateway 130 and/or to schedule servicing of the requests by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write requests from gateway 130 that request to read data stored in NAND flash memory system 150 and/or to store data in NAND flash memory system 150. Flash controllers 140 service these requests, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, a request received by flash controller 140 from a host device, such as a processor system 102, contains the logical block address (LBA) at which the data is to be accessed (read or written) and, if a write request, the write data to be stored to data storage system 120. The request may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Multi-Level Cell (MLC), Three Level Cell (TLC), or Quad Level Cell (QLC) NAND flash memory modules. The effective storage capacity provided by flash memory storage devices 152 can be increased through the implementation of data compression, for example, by flash controllers 140 and/or high level controllers, such as GPPs 132, RAID controllers 124 or SMCs 123.

Figure 2:
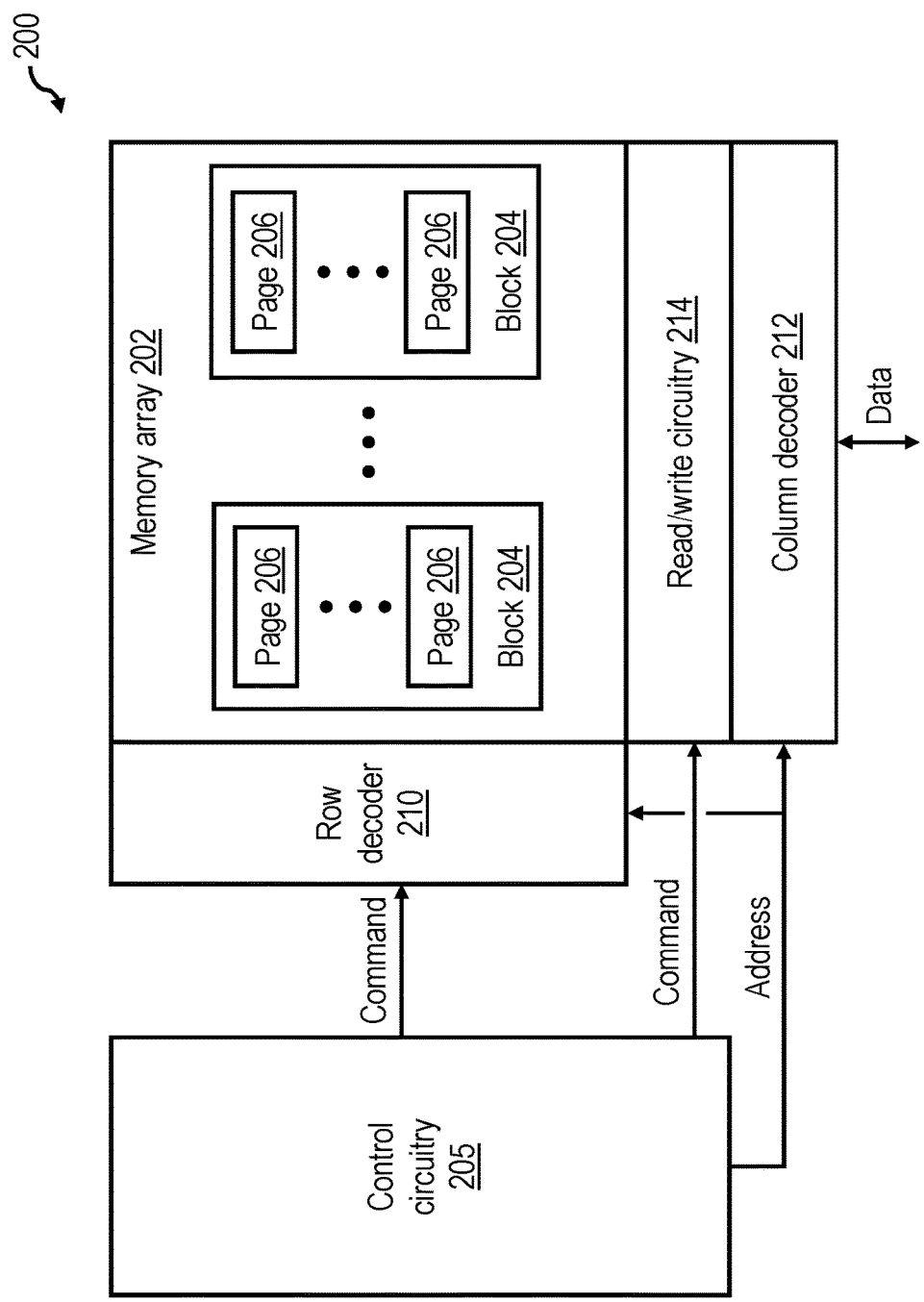
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two-dimensional or three-dimensional array of NAND flash memory cells. As indicated in FIG. 2, the memory cells within memory array 202 are physically arranged in multiple physical blocks 204, each in turn including multiple physical pages 206. These pages can be managed in page groups, which can each be formed, for example, of all the pages coupled to a common wordline, of all pages in one or more layers in a 3D NAND flash, of a set of pages in one or more layers, or generally of pages with similar characteristics.

As is known to those skilled in the art, NAND flash memory, such as that employed in memory array 202, must be erased prior to being programmed. Further, NAND flash memory can be (but is not required to be) constrained by its construction such that the smallest granule of storage that can be erased is a block 204 and the smallest granule of storage that can be accessed by a read or write request is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus host multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices (e.g., hosts) to directly address and/or access the physical memory locations within NAND flash memory systems 150. Instead, data storage system 120 is generally configured to present to host devices one or more logical volumes each having a contiguous logical address space, thus allowing host devices to read and write data to and from logical block addresses (LBAs) within the logical address space while permitting one or more of the various levels of controllers (e.g., system management controller 123, RAID controllers 124, flash controllers 140 and GPP 132) to control where the data that is associated with the various LBAs actually resides in the physical memory locations comprising NAND flash memory systems 150. In this manner, performance and longevity of NAND flash memory systems 150 can be intelligently managed and optimized.

In the illustrated embodiment, each flash controller 140 performs logical-to-physical address translation for an associated set of LBAs using a logical-to-physical address translation data structure, such as logical-to-physical translation (LPT) table 300, which can be stored, for example, in the associated flash controller memory 142. It should be noted that the logical address supplied to flash controller(s) 140 may be different from the logical address originally supplied to data storage system 120, since various components within data storage system 120 may perform address translation operations between the external devices and the flash controller(s) 140.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains one RTU queue 306 per channel or plane (i.e., per data bus), and an identifier of each erased block that is to be reused is enqueued in the RTU queue 306 corresponding to its channel or plane. Additionally, separate RTU queues 306 may be maintained for different health grades, heat bin/write streams, or block operation modes, i.e. SLC or QLC operation mode. A build block stripes function 320 performed by flash management code running on the GPP 132 constructs new block stripes for storing data and associated parity information from the erased blocks enqueued in RTU queues 306. The new block stripes are then queued to the flash controller 140 for data placement. Block stripes are preferably formed of blocks residing in different channels, meaning that build block stripes function 320 can conveniently construct a block stripe by drawing each block of the new block stripe from a different RTU queue 306. In general, build block stripes function 320 attempts to construct stripes from blocks of approximately equal health (i.e., expected remaining useful life).

In response to write request received from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that the associated data is no longer valid. In addition, data placement function 310 allocates a page stripe if necessary to store the write data of the write request and any non-updated data (i.e., for write requests smaller than a logical page, the remaining valid data from a previous write to the same logical address which is not being overwritten and which must be handled in a read-modify-write manner) from an existing page stripe, if any, targeted by the write request, and/or stores the write data of the write request and any non-updated (i.e., still valid) data from an existing page stripe, if any, targeted by the write request to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation and the "heat" (i.e., estimated or measured write access frequency) of the LBA of the write data. Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. Thereafter, flash controller 140 can access the data to service host read requests by reference to LPT table 300 as further illustrated in FIG. 3.

Once all pages in a block stripe have been written, flash controller 140 places the block stripe into one of occupied block queues 302, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the blocks 204 within the block stripes and how much of the data within the erase blocks 204 is invalid. In the illustrated example, garbage collection is performed on entire block stripes, and flash management code running on GPP 132 logs the block stripes ready to be recycled in a relocation queue 304, which can conveniently be implemented in the associated flash controller memory 142 or GPP memory 134.

The flash management functions performed by GPP 132 or flash controller 140 additionally include a relocation function 314 that relocates the data held in block stripes enqueued in relocation queue 304. To relocate such data, relocation function 314 issues relocation write requests to data placement function 310 to request that the valid data of the old block stripe be written to a new block stripe in NAND flash memory system 150. In addition, relocation function 314 updates LPT table 300 to remove the current association between the logical and physical addresses of the data. Once all remaining valid data has been moved from the old block stripe, the old block stripe is passed to dissolve block stripes function 316, which decomposes the old block stripe into its constituent blocks 204, thus disassociating the blocks 204. Each of the blocks 204 formerly forming the dissolved block stripe is then erased under the direction of flash controller 140 and/or the control circuitry 205 of the relevant flash memory module 200, and a corresponding program/erase (P/E) cycle count 334 for each erased block is incremented. Based on the health metrics 332 of each erased block 204 (e.g., bit error rate (BER) metrics, uncorrectable errors, P/E cycle count, etc.), each erased block 204 is either retired (i.e., withdrawn from use) by a block retirement function 318 among the flash management functions executed on GPP 132, or alternatively, prepared for reuse by placing an identifier of the block 204 on the appropriate ready-to-use (RTU) queue 306 in the associated GPP memory 134.

Figure 3:
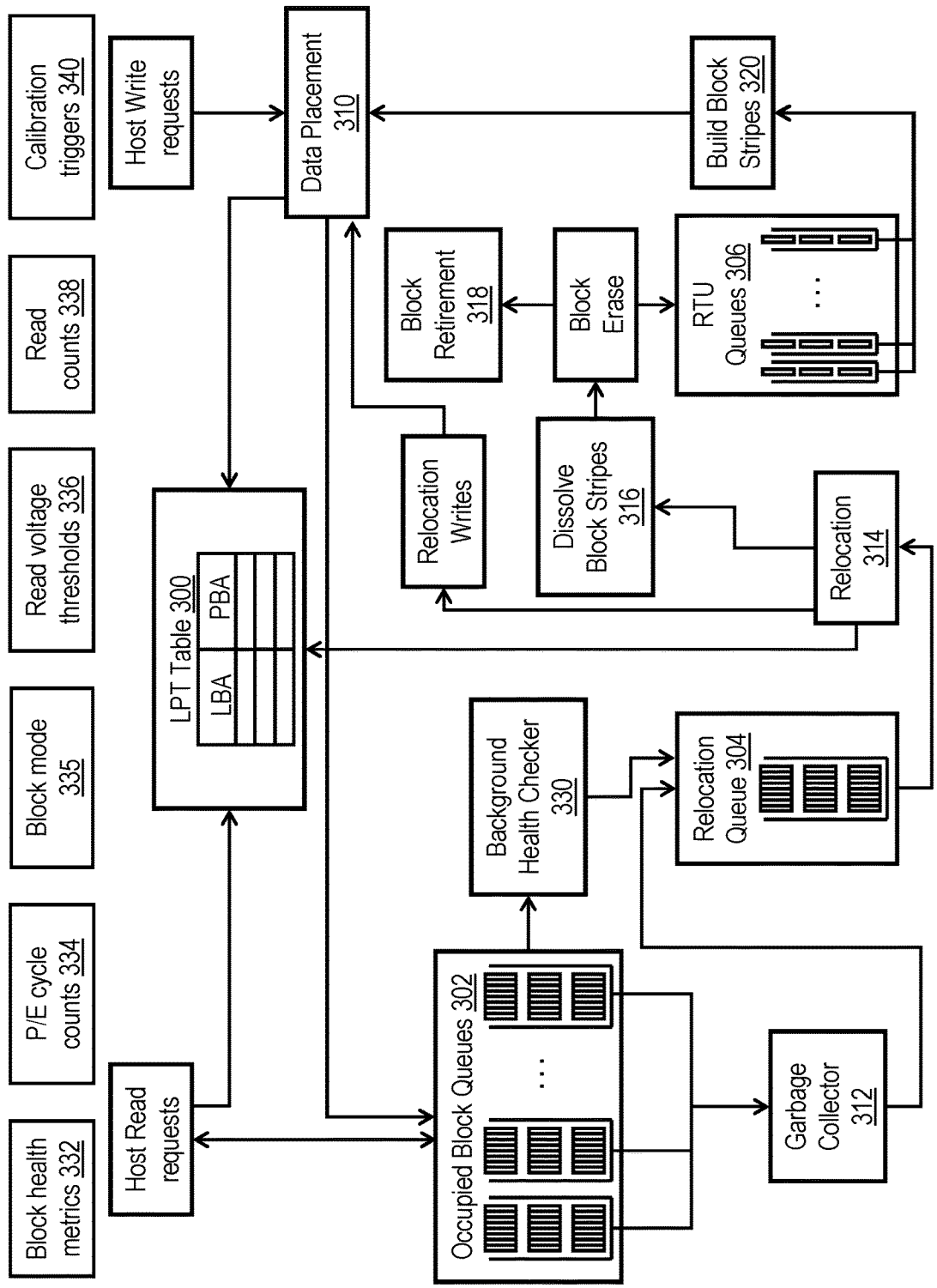
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the read and write requests of hosts such as processor systems 102, continuously determines one or more block health metrics 332 for blocks belonging to block stripes recorded in occupied block queues 302. Based on the one or more of the block health metrics 332, background health checker 330 places block stripes on relocation queue 304 for handling by relocation function 314. Key block health metrics 332 preferably monitored and recorded by background health checker relate to the bit error rate (BER) metrics observed for valid blocks and physical pages, and may include, for example, the worst page BER of each block, the mean page BER of each block, the rates of change of the worst page BER and mean page BER of each block, etc. In order to obtain the most accurate health estimate possible, health can be determined from an analysis of valid and invalid data, thereby ensuring that blocks containing almost entirely invalid data are fully analyzed to determine overall block health.

One function of GPP 132 and/or flash controller 140 that can be incorporated within background health checker 330 or that can be separately implemented is the periodic adaptation (calibration) of read voltage thresholds 336 utilized to decode the data bits stored within the memory cells of memory arrays 202. These read voltage thresholds 336, which can be individually defined to any desired level of granularity (e.g., per-page, per page group within a block, per block, etc.), are preferably selected to improve one or more bit error metrics. As further depicted in FIG. 3, GPP 132 and/or flash controller 140 preferably track additional statistics to facilitate intelligent adaptation of read voltage thresholds 336. These additional statistics can include, for example, P/E cycle counts 334 identifying a number of program/erase cycles to which each block has been subjected and read counts 338 indicating a number of times a given memory unit (e.g., page, page group and/or block) has been read since being programmed. In addition, these statistics can include calibration triggers 340, such as per-memory unit counters indicating an elapsed amount of time since read voltage thresholds of that memory unit were adapted and/or per-block counters indicating a number of program/erase cycles that each block has been subjected to since the read voltage thresholds for that block were last adapted.

Referring now to FIG. 4, there is depicted an exemplary storage architecture that may be implemented in a non-volatile memory device. In this example, a GPP 132 and/or flash controller 140 (referred to generally herein as a "controller") configures some or all of flash memory storage devices 152 in a NAND flash memory system 150 to implement multiple pools of physical blocks 204 where the physical blocks 204 in the different block pools are configured to operate in different modes storing different numbers of bits per cell. Thus, in this example, although all of a memory array 202 comprises, for example, QLC flash memory capable of storing four bits per cell, a controller assigns some of the physical blocks 204 in the memory array 202 of a flash storage device 152 to a QLC pool 400 in which fully programmed blocks store four bits per cell and assigns other physical blocks 204 of the memory array 202 to an SLC pool 402 in which fully programmed blocks store only a single bit per cell. Pool membership information can be stored, for example, in GPP memory 124 and/or flash controller memory 142, as block mode metadata 335. As noted above, operating blocks in multiple different modes in this manner can provide improved performance and/or endurance if frequently written LBAs are mapped to physical blocks 204 within SLC pool 402.

Although not required, in some embodiments, the controller organizes the QLC pool 400 and SLC pool 402 in tiered arrangement in which data contained in host write requests are first written into physical blocks 204 selected from SLC pool 402, as indicated by arrow 404. As SLC pool 402 fills through use and more capacity is needed and/or desired in SLC pool 402, the controller destages data from SLC pool 402 to QLC pool 400 via relocation writes, as indicated by arrow 406. To ensure an adequate supply of physical blocks 204 in both of block pools 400 and 402 as the blocks are subjected to wear, the controller additionally transfers (reassigns) blocks 204 between pools 400 and 402 as needed and/or desired to provide storage capacity and/or endurance. The transfer of physical blocks 204 (as opposed to data) between block pools 400 and 402 is depicted in FIG. 4 by arrow 408.

The present disclosure appreciates that the process for transferring blocks between block pools 400 and 402, if not carefully designed, can undesirably lead to reduced performance (due to increased error recovery activities) or even to data loss in cases when the error recovery is unsuccessful (e.g., if blocks with a high bit error rate are transferred from block pool 402 to block pool 400). In general, the controller transfers blocks between block pools 400 and 402 by selecting less/least healthy blocks from block pool 400 to transfer to block pool 402 and by selecting more/most healthy blocks from block pool 402 to transfer to block pool 400.

The present disclosure appreciates that this general mode conversion policy, while appropriate for some systems, is suboptimal in systems that employ heat segregation or have very high device utilization, which may lead directly to accelerated wearout and even early device retirement. One reason for these negative effects is that the wear (as measured, for example, by average P/E cycles) of the blocks 204 in QLC pool 400 may in certain conditions be generally much higher than the wear of the blocks 204 in SLC pool 402 due, in part, to write amplification. FIG. 5 is a graph of write amplification versus device utilization for an exemplary tiered storage architecture as shown in FIG. 4. As shown, under high device utilization (e.g., when over 90% of a flash memory device is written with data), the write amplification of QLC pool 400 can increase exponentially, resulting in increasingly rapid wearout of blocks in QLC pool 400. As discussed in greater detail below, the mode conversion policy therefore preferably takes block wear into account when selecting blocks to transfer between block pools.

Figure 6:
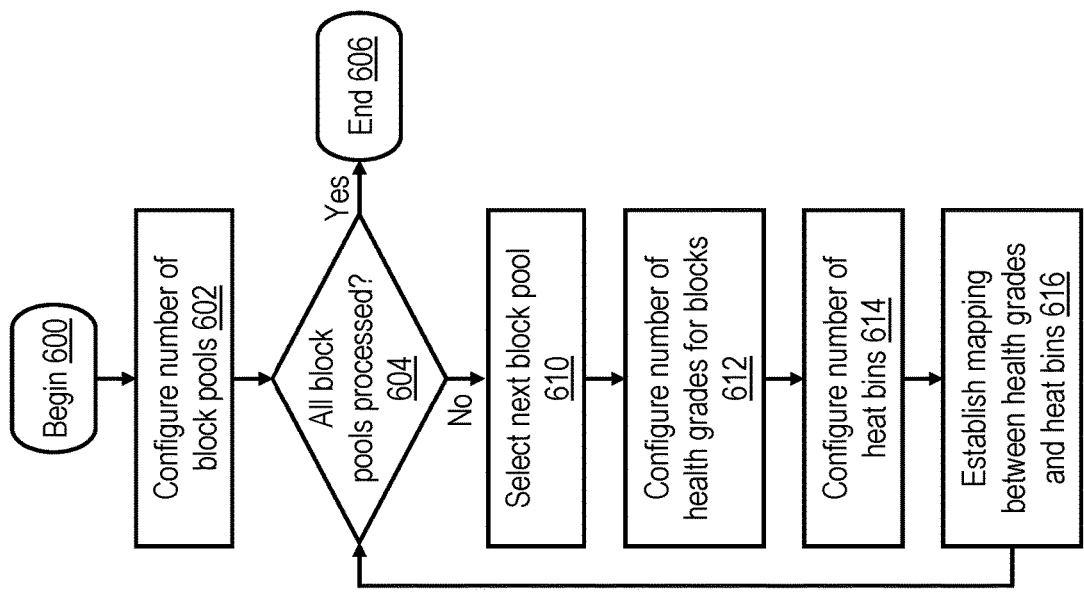
FIG. 6 is a high level logical flowchart of an exemplary process for configuring a non-volatile memory in accordance with one embodiment.

Referring now to FIG. 6, there is depicted a high level logical flowchart of an exemplary process for configuring a non-volatile memory in accordance with one embodiment. The illustrated process can be performed, for example, by a controller (e.g., GPP 132 and/or flash controller 140) in hardware, firmware, software or a combination thereof at startup of data storage system 120. As with the other logical flowcharts presented herein, operations are presented in logical rather than strictly chronological order, and in some embodiments, operations can be performed in a different order than presented or concurrently.

The configuration process of FIG. 6 begins at block 600 and then proceeds to block 602, which illustrates a controller of a flash memory device 152 configuring a desired number of block pools. In the example of FIG. 4, the controller implements two block pools at block 602, namely, QLC block pool 400 and SLC block pool 402. In other embodiments, a greater number of block pools and/or block pools operating in different block modes (e.g., TLC or MLC) can be implemented. The controller additionally assigns an initial number of physical blocks 204 to each block pool and, based on the block pool membership of each physical block 204, records the corresponding block mode of each physical block 204 in block mode metadata 335.

The process proceeds from block 602 to block 604, which illustrates the controller entering a processing loop in which each of the block pools implemented at block 602 is processed. If the controller determines at block 604 that all block pools have not yet been processed, the process passes to block 610, which depicts the controller selecting a next block pool to process (e.g., QLC pool 400 or SLC pool 402). At block 612, the controller then configures a desired number of health grades for blocks 204 belonging to the selected block pool. In various embodiments, the number of health grades can vary, but experimentally a number of health grades between two and eight inclusive has been found to be effective. For example, in one embodiment depicted in FIG. 4, controller configures four health grades 410a-410d or 412a-412d at block 612. The health grades employed herein are specifically defined to be based on at least one criterion other than merely the number of program/erase (P/E) cycles, for example, one or more bit error metrics for each block (and/or the physical pages within each block) of physical memory. For example, in one embodiment, the various health grades are defined by respective ranges of worst page BER determined within a small number of read accesses following programming, as this bit error metric accurately reflects the permanent effects of wear on the blocks. Based on the measured worst page BER, the healthiest blocks are those with the lowest worst page BER soon after programming, and the least healthy blocks are those with the highest worst page BER soon after programming.

At block 614, the controller additionally configures a desired number of heat bins for LBAs served by the flash memory storage device 152. Each heat bin corresponds to a respective range of write heat (i.e., write frequency) for the LBAs. In various embodiments, the number of heat bins can vary, but experimentally a number of heat bins between two and eight inclusive has been found to be effective. For example, in one embodiment, the controller configures four heat bins at block 614 respectively corresponding to hot LBAs written most frequently, warm LBAs written less frequently, cool LBAs written still less frequently, and cold LBAs written least frequently. The set of host write requests targeting LBAs within a given heat bin are referred to herein as a "write stream." The number of heat bins (and thus write streams) configured at block 614 may, but need not, equal the number of health grades configured at block 612.

At block 616, the controller establishes a mapping between the heat bins configured at block 612 and the health grades configured at block 614. In one particularly preferred embodiment, heat and health are directly correlated, with the hottest LBAs mapped to the healthiest grade and the coldest LBAs mapped to a less healthy grade. Of course, in other embodiments, other mappings between write heat and health grades may be employed. For example, in one embodiment in which numeric write heat and health grades are employed, the mapping established at block 616 is determined by a mathematical function selected to yield an approximately constant result from health grades and write heats that are mapped to one another (e.g., $C \approx f$ (heat, health)). In another embodiment, the mapping from write heat to health grade maps every heat bin to a sorted priority list of health grades. At the time block stripes are built from blocks in RTU queues 306, there might not be a block in the preferred RTU queue 306 with a given health grade. The sorted priority list then allows assignment of a block from another RTU queue 306 with a health grade as close as possible to the preferred one.

Following block 616, the configuration process given in FIG. 6 returns to block 604. If a negative determination is made at block 604, indicating that one or more additional block pools remain to be processed, the process returns to blocks 610-616, which have described. If, however, a determination is made at block 604 that all block pools configured at block 602 have been processed, the configuration process of FIG. 6 ends at block 606.

Figure 7:
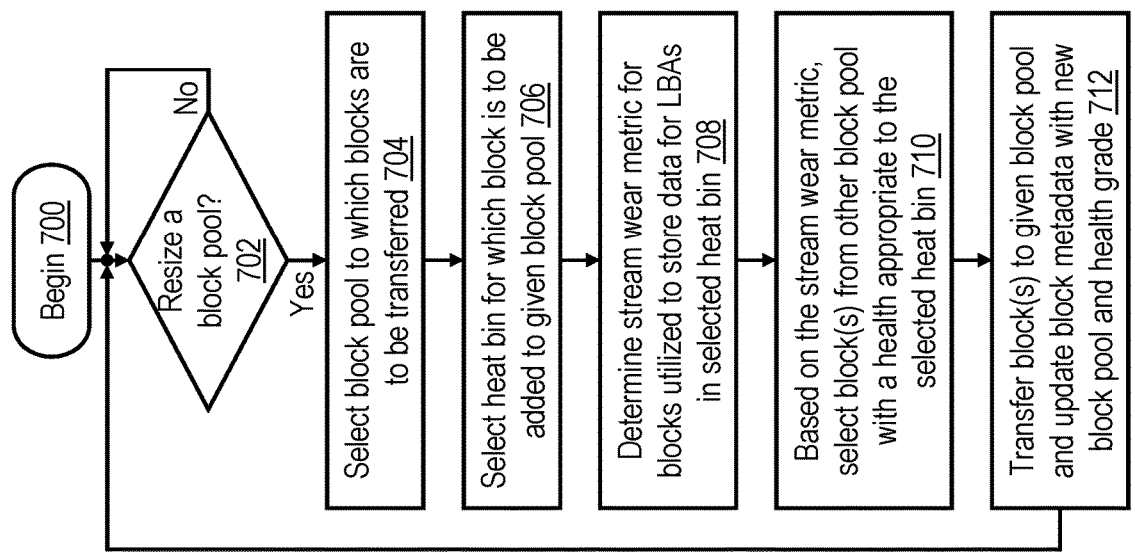
FIG. 7 is a high level logical flowchart of an exemplary process for dynamically transferring blocks between block pools in accordance with one embodiment.

With reference now to FIG. 7, there is illustrated a high level logical flowchart of an exemplary process for dynamically transferring blocks between block pools in accordance with one embodiment. The illustrated process can be performed, for example, by a controller (e.g., GPP 132 and/or flash controller 140) in hardware, firmware, software or a combination thereof during operation of data storage system 120.

The process of FIG. 7 begins at 700 and then proceeds to block 702, which depicts the controller determining whether or not to resize one of block pools 400 and 402. For example, the controller may determine whether or not to resize a given block pool based on one or more criteria, including the fill level of blocks belonging to the given block pool within one or more RTU queues 306 failing to satisfy a threshold, the fill level of blocks belonging to another block pool within one or more RTU queues 306, the P/E cycle counts of blocks within the given block pool, the number of blocks within the given block pool that are assigned one or more of the health grades, etc. The determination made at block 702 may be triggered, for example, by one or more of background health checker 330, garbage collector 312, block retirement function 318, and/or build block stripes function 320. In response to the controller determining at block 702 not to resize a block pool, the process iterates at block 702. In response to a determination at block 702 that a block pool is to be resized, the process proceeds to block 704.

Block 704 illustrates the controller selecting the block pool to which physical blocks 204 are to be transferred. In addition, at block 706, the controller selects the heat bin or write stream (e.g., hot, warm, cool, or cold) for which a physical block 204 is to be added to the given block pool. The controller then determines at block 708 a stream wear metric for blocks 204 that are currently allocated to store data associated with LBAs in the selected heat bin. In one preferred embodiment, the controller tracks the blocks 204 assigned to each heat bin/write stream and determines (e.g., from P/E cycle counts 334) the total number of the P/E cycles to which those blocks 204 have been subjected. From these numbers, the controller can calculate the stream wear metric for the selected heat bin as the total number of blocks 204 storing data in the heat bin divided by the total number of P/E cycles to which those blocks 204 have been subjected.

Based on the stream wear metric determined at block 708, the controller then selects at least one unprogrammed block 204 from the other block pool to transfer to the selected block pool that has an individual block health appropriate for the selected heat bin (block 710). This selection ensures that the healthiest blocks 204 will be subject to the highest number of future P/E cycles, and the least healthy blocks 204 will be the subject to the fewest number of future P/E cycles. As a result, device endurance is improved for all types of workloads and all device utilization points. At block 712, the controller transfers the block(s) 204 selected at block 710 to the selected block pool, updates the block mode metadata 335 with the new operating mode (e.g., QLC or SLC), and, if necessary, updates the block health grade. Thereafter, the process of FIG. 7 returns to block 702, which has been described.

As has been described, in at least one embodiment, a non-volatile memory includes a plurality of physical blocks of storage each including a respective plurality of cells, where each of the plurality of cells is individually capable of storing multiple bits of data. A controller assigns physical blocks among the plurality of physical blocks to a first pool containing physical blocks operating in a first (e.g., QLC) mode for storing a greater number of bits per cell and assigns other physical blocks among the plurality of physical blocks to a second pool containing physical blocks operating in a second (e.g., SLC) mode for storing a lesser number of bits per cell. The controller transfers physical blocks between the first pool and the second pool based on at least bit error rates measured for the transferred physical blocks.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signalsper se, and energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of operating a non-volatile memory including a plurality of physical blocks of storage each including a respective plurality of cells, wherein each of the plurality of cells is individually capable of storing multiple bits of data, the method comprising:
a controller assigning physical blocks among the plurality of physical blocks to a first pool containing physical blocks operating in a first mode for storing a greater number of bits per cell and assigning other physical blocks among the plurality of physical blocks to a second pool containing physical blocks operating in a second mode for storing a lesser number of bits per cell;
for each of the first and second pools:
tracking a respective number of physical blocks allocated to store data for each of a plurality of write streams of differing write heats and a respective aggregate number of program/erase (P/E) cycles of the physical blocks assigned to each of the plurality of write streams; and
for each of the plurality of write streams, calculating a respective stream wear metric based on the respective number of physical blocks assigned to the write stream and the aggregate number of P/E cycles of the physical blocks assigned to the write stream; and
the controller transferring physical blocks between the first pool and the second pool, wherein the transferring includes selecting physical blocks for transfer between the first and second pools based on (1) a selected write stream among the plurality of write streams, (2) the stream wear metric of the selected write stream, and (3) block health of physical blocks allocated to store data for the selected write stream.

2. The method of claim 1, wherein the transferring includes:
transferring, from the first pool to the second pool, physical blocks having a higher bit error rate; and
transferring, from the second pool to the first pool, physical blocks having a lower bit error rate.

3. The method of claim 1, and further comprising the controller determining block health of physical blocks in all of the plurality of write streams from a bit error rate measured shortly after programming the physical blocks.

4. The method of claim 1, wherein the selecting includes:
based on the selected write stream having a stream wear metric reflecting a greatest wear among all of the plurality of write streams, selecting, for transfer, healthiest physical blocks from among the physical blocks allocated to the selected write stream; and
based on the selected write stream having a stream wear metric reflecting a least wear among all of the plurality of write streams, selecting, for transfer, least healthy physical blocks from among the physical blocks allocated to the selected write stream.

5. The method of claim 1, wherein:
the first mode is a quad level cell (QLC) mode; and
the second mode is a single level cell (SLC) mode.

6. The method of claim 1, wherein the transferring comprises transferring the physical blocks based on an available number of unprogrammed physical blocks from a given one of the first and second pools not satisfying a threshold.

7. A data storage system, comprising:
a controller for a non-volatile memory including a plurality of physical blocks of storage each including a respective plurality of cells, wherein each of the plurality of cells is individually capable of storing multiple bits of data, wherein the controller is configured to perform:
assigning physical blocks among the plurality of physical blocks to a first pool containing physical blocks operating in a first mode for storing a greater number of bits per cell and assigning other physical blocks among the plurality of physical blocks to a second pool containing physical blocks operating in a second mode for storing a lesser number of bits per cell;
for each of the first and second pools:
tracking a respective number of physical blocks allocated to store data for each of a plurality of write streams of differing write heats and a respective aggregate number of program/erase (P/E) cycles of the physical blocks assigned to each of the plurality of write streams; and
for each of the plurality of write streams, calculating a respective stream wear metric based on the respective number of physical blocks assigned to the write stream and the aggregate number of P/E cycles of the physical blocks assigned to the write stream; and
transferring physical blocks between the first pool and the second pool, wherein the transferring includes selecting physical blocks for transfer between the first and second pools based on (1) a selected write stream among the plurality of write streams, (2) the stream wear metric of the selected write stream, and (3) block health of physical blocks allocated to store data for the selected write stream.

8. The data storage system of claim 7, wherein the transferring includes:
transferring, from the first pool to the second pool, physical blocks having a higher bit error rate; and
transferring, from the second pool to the first pool, physical blocks having a lower bit error rate.

9. The data storage system of claim 7, wherein the controller is further configured to perform:
determining block health of physical blocks in all of the plurality of write streams from a bit error rate measured shortly after programming the physical blocks.

10. The data storage system of claim 7, wherein the selecting includes:
based on the selected write stream having a stream wear metric reflecting a greatest wear among all of the plurality of write streams, selecting, for transfer, healthiest physical blocks from among the physical blocks allocated to the selected write stream; and based on the selected write stream having a stream wear metric reflecting a least wear among all of the plurality of write streams, selecting, for transfer, least healthy physical blocks from among the physical blocks allocated to the selected write stream.

11. The data storage system of claim 7, wherein:
the first mode is a quad level cell (QLC) mode; and
the second mode is a single level cell (SLC) mode.

12. The data storage system of claim 7, wherein the transferring comprises transferring the physical blocks based on an available number of unprogrammed physical blocks from a given one of the first and second pools not satisfying a threshold.

13. A computer program product, the computer program product comprising a computer readable storage medium having program instructions embodied therewith, the program instructions being executable by a controller of a non-volatile memory including a plurality of cells each individually capable of storing multiple bits of data, wherein, when executed, the program instructions cause the controller to perform:
assigning physical blocks among the plurality of physical blocks to a first pool containing physical blocks operating in a first mode for storing a greater number of bits per cell and assigning other physical blocks among the plurality of physical blocks to a second pool containing physical blocks operating in a second mode for storing a lesser number of bits per cell;
for each of the first and second pools:
tracking a respective number of physical blocks allocated to store data for each of a plurality of write streams of differing write heats and a respective aggregate number of program/erase (P/E) cycles of the physical blocks assigned to each of the plurality of write streams; and
for each of the plurality of write streams, calculating a respective stream wear metric based on the respective number of physical blocks assigned to the write stream and the aggregate number of P/E cycles of the physical blocks assigned to the write stream; and
transferring physical blocks between the first pool and the second pool, wherein the transferring includes selecting physical blocks for transfer between the first and second pools based on (1) a selected write stream among the plurality of write streams, (2) the stream wear metric of the selected write stream, and (3) block health of physical blocks allocated to store data for the selected write stream.

14. The program product of claim 13, wherein the transferring includes:
transferring, from the first pool to the second pool, physical blocks having a higher bit error rate; and
transferring, from the second pool to the first pool, physical blocks having a lower bit error rate.

15. The program product of claim 13, wherein the program instructions further cause the controller to perform:
determining block health of physical blocks in all of the plurality of write streams from a bit error rate measured shortly after programming the physical blocks.

16. The program product of claim 13, wherein the selecting includes:
based on the selected write stream having a stream wear metric reflecting a greatest wear among all of the plurality of write streams, selecting, for transfer, healthiest physical blocks from among the physical blocks allocated to the selected write stream; and
based on the selected write stream having a stream wear metric reflecting a least wear among all of the plurality of write streams, selecting, for transfer, least healthy physical blocks from among the physical blocks allocated to the selected write stream.

17. The program product of claim 13, wherein the transferring comprises transferring the physical blocks based on an available number of unprogrammed physical blocks from a given one of the first and second pools not satisfying a threshold.

* * * * *